United States Patent
Chin et al.

(10) Patent No.: US 11,362,650 B2
(45) Date of Patent: Jun. 14, 2022

(54) OVERCURRENT PROTECTION BY DEPLETION MODE MOSFET AND BI-METALLIC TEMPERATURE SENSING SWITCH

(71) Applicant: Littelfuse, Inc., Chicago, IL (US)

(72) Inventors: Chuan Fang Chin, Taipei (TW); Teddy To, Tsuen Wan (HK)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 17/018,269

(22) Filed: Sep. 11, 2020

(65) Prior Publication Data

US 2022/0085802 A1   Mar. 17, 2022

(51) Int. Cl.
| | | |
|---|---|---|
| *H03K 17/081* | (2006.01) |
| *H03K 17/0812* | (2006.01) |
| *G01K 3/00* | (2006.01) |
| *G01K 7/01* | (2006.01) |

(52) U.S. Cl.
CPC ....... *H03K 17/08116* (2013.01); *G01K 3/005* (2013.01); *G01K 7/015* (2013.01); *H03K 17/08122* (2013.01)

(58) Field of Classification Search
CPC ....... H03K 17/08116; H03K 17/08122; G01K 7/015; G01K 3/005
See application file for complete search history.

(56) References Cited

U.S. PATENT DOCUMENTS

| | | | | |
|---|---|---|---|---|
| 5,875,085 | A | * | 2/1999 | Farley ................ H02J 7/00306 361/18 |
| 6,055,977 | A | * | 5/2000 | Linard ................ F24B 13/002 126/200 |
| 7,030,769 | B2 | | 4/2006 | Miller |
| 8,203,816 | B2 | * | 6/2012 | Pitio ..................... G01D 13/00 361/93.1 |
| 10,446,352 | B2 | * | 10/2019 | Song ...................... H01H 61/04 |
| 10,985,552 | B2 | * | 4/2021 | Tada ..................... H02J 7/0026 |
| 11,002,609 | B2 | * | 5/2021 | Bass ....................... G01K 1/024 |
| 11,043,348 | B2 | * | 6/2021 | Takeda .................. H01H 37/52 |
| 11,183,851 | B1 | | 11/2021 | Chen |
| 2002/0053066 | A1 | * | 5/2002 | Richter ................. G05B 17/02 716/106 |

(Continued)

FOREIGN PATENT DOCUMENTS

| | | |
|---|---|---|
| DE | 19506161 A1 | 8/1996 |
| EP | 0345411 A2 | 12/1989 |

(Continued)

OTHER PUBLICATIONS

European Search Report dated Jan. 21, 2022 for European Patent Application No. 21195454.0.

*Primary Examiner* — Sisay G Tiku
(74) *Attorney, Agent, or Firm* — Kacvinsky Daisak Bluni PLLC

(57) ABSTRACT

Circuits for providing overcurrent and overvoltage protection are disclosed herein. The circuits feature a depletion mode MOSFET (D MOSFET) as a current limiter, the D MOSFET being connected to a bi-metallic switch, where the bi-metallic switch acts as a temperature sensing circuit breaker. In combination, the D MOSFET and bi-metallic switch are able to limit current to downstream circuit components, thus protecting the components from damage.

14 Claims, 11 Drawing Sheets

(56) References Cited

U.S. PATENT DOCUMENTS

| | | | |
|---|---|---|---|
| 2005/0103613 A1* | 5/2005 | Miller | H01H 71/04 |
| | | | 200/400 |
| 2006/0018059 A1 | 1/2006 | Elms et al. | |
| 2007/0297113 A1 | 12/2007 | Domitrovich et al. | |
| 2009/0168273 A1* | 7/2009 | Yu | H01H 9/542 |
| | | | 361/13 |
| 2011/0193675 A1 | 8/2011 | Darr et al. | |
| 2012/0212210 A1* | 8/2012 | Takeda | H01H 37/54 |
| | | | 323/370 |
| 2014/0029152 A1 | 1/2014 | Mazzola et al. | |
| 2016/0174340 A1* | 6/2016 | Rezeanu | H04B 3/50 |
| | | | 315/200 R |
| 2016/0352318 A1* | 12/2016 | Amit | H03K 5/08 |
| 2017/0179462 A1 | 6/2017 | Bourns et al. | |
| 2017/0179713 A1* | 6/2017 | Bourns | H01M 50/581 |
| 2018/0159322 A1* | 6/2018 | Zmuda | A61N 1/36125 |
| 2019/0199340 A1* | 6/2019 | Plesnik | H03K 17/145 |
| 2019/0393696 A1 | 12/2019 | Tada et al. | |
| 2020/0059084 A1 | 2/2020 | Morioka et al. | |
| 2020/0328053 A1* | 10/2020 | Hong | H01H 37/002 |
| 2020/0366079 A1* | 11/2020 | Telefus | H01H 33/593 |
| 2022/0014014 A1 | 1/2022 | Chen | |

FOREIGN PATENT DOCUMENTS

| | | |
|---|---|---|
| EP | 0345412 A2 | 12/1989 |
| EP | 1681753 A1 | 7/2006 |
| KR | 20060050897 A | 5/2006 |

\* cited by examiner

| DMOS | BREAKER | R | INPUT VOLTAGE | CURRENT | VDS | VGS | TIME TO TRIP |
|---|---|---|---|---|---|---|---|
| IXTH16N50D2 | KSD-01F(60C) | 0ohm | 10V | 6A | 1.06V | / | 17.5S |
| | | 0ohm | 10V | 8A | 1.89V | / | 8S |
| | | 0ohm | 10V | 10A | 2.95V | / | 5.8S |
| | | 0ohm | 10V | 12A | 4.27V | / | 3.7S |
| | | 0ohm | 10V | 14A | 7.2V | / | 2.5S |
| | | 0ohm | 10V | 16A | 8.8V | / | 1.75S |
| | | 0ohm | 15V | 20A | 13.4V | / | 0.8S |
| | | 0ohm | 35V | 24A | 33.2V | / | 0.65S |
| NO | KSD-01F(60C) | / | 6A | 6A | | | NO TRIP TEMPERATURE ~43C |
| | | / | 10V | 8A | | | 48S~57S |
| | | / | 10V | 10A | | | 19S |
| | | / | 10V | 12A | | | 8S |
| | | / | 10V | 14A | | | 4.5S |
| | | / | 10V | 16A | | | 2.3S |
| | | / | 10V | 20A | | | 1.4S |
| | | / | 10V | 24A | | | 0.82S |

OVERCURRENT PROTECTION BY DEPLETION MODE MOSFET AND BI-METALLIC TEMPERATURE SENSING SWITCH

BACKGROUND

Overcurrent or excess current is a situation in which a larger than intended electrical current flows through a circuit. Overcurrent may be constant or transient in nature. Voltage transients, short duration surges of electrical energy, are the result of the sudden release of energy previously stored or induced by other means, such as heavy inductive loads or lightning. Repeatable transients are frequently caused by the operation of motors, generators, or the switching of reactive circuit components. Random transients, may be caused by lightning and Electrostatic Discharge (ESD).

Component miniaturization has resulted in increased sensitivity to electrical stresses. Microprocessors for example, have structures and conductive paths which are unable to handle high currents from ESD transients. Such components operate at very low voltages, so a high priority is given to controlling voltage disturbances to prevent device interruption and latent or catastrophic failures.

It is with respect to these and other considerations that the present improvements may be useful.

SUMMARY

This Summary is provided to introduce a selection of concepts in a simplified form that are further described below in the Detailed Description. This Summary is not intended to identify key or essential features of the claimed subject matter, nor is it intended as an aid in determining the scope of the claimed subject matter.

An exemplary embodiment of a circuit operable to provide overcurrent protection is disclosed. The circuit includes a metal oxide semiconductor field effect transistor (MOSFET) connected to a bi-metallic switch. The bi-metallic switch has first and second terminals, each terminal being connected to a node, with one of the nodes being connected to a drain of the MOSFET. Together, the bi-metallic switch and the MOSFET protect the circuit during an overcurrent event.

An exemplary embodiment of a device operable to provide overcurrent protection to a circuit is disclosed. The device is connected to the circuit and includes a MOSFET connected to a bi-metallic switch. The bi-metallic switch has first and second terminals, each terminal being connected to a node, with one of the nodes being connected to a drain of the MOSFET. Together, the bi-metallic switch and the MOSFET protect the circuit during an overcurrent event.

BRIEF DESCRIPTION OF THE DRAWINGS

FIG. 8 is a table providing results of overcurrent test current operations performed on the circuits of FIGS. 2 and 3, in accordance with exemplary embodiments;

DETAILED DESCRIPTION

Figure 1:
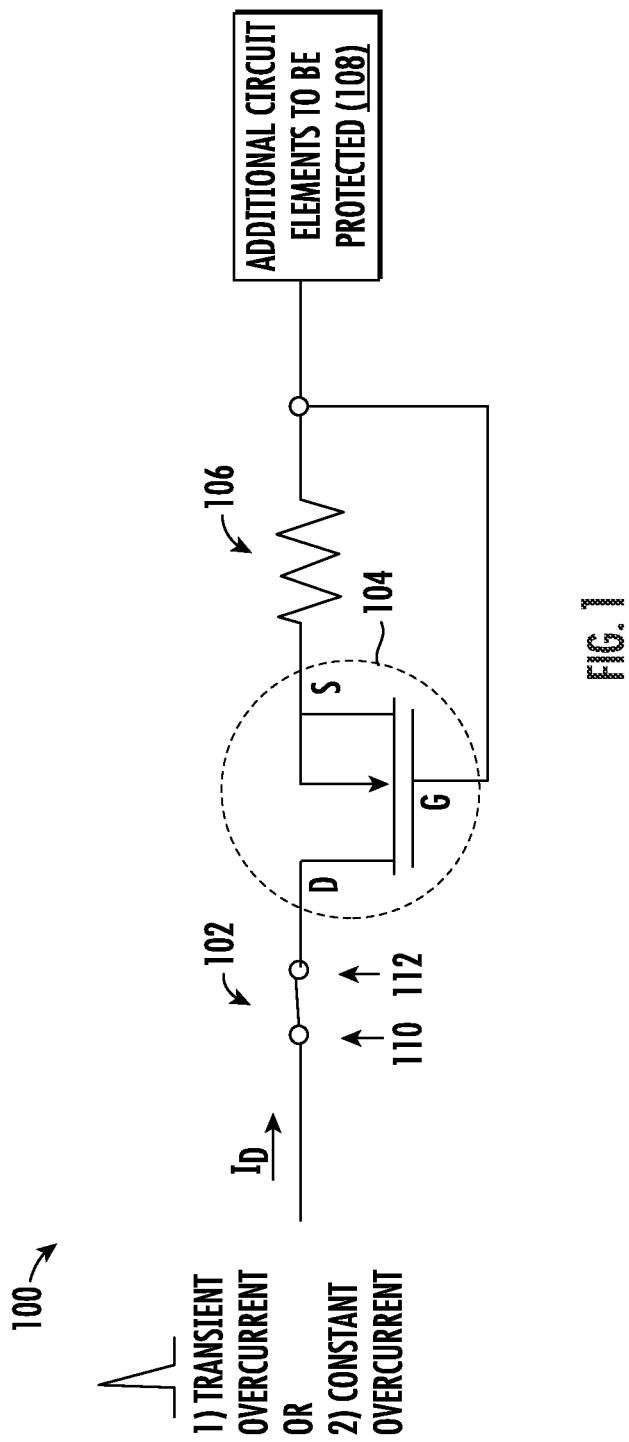
FIG. 1 is a diagram illustrating a protection circuit including a bi-metallic switch and a D MOSFET, in accordance with exemplary embodiments.

Circuits for providing overcurrent and overvoltage protection are disclosed herein. The circuits feature a depletion mode MOSFET (D MOSFET) as a current limiter, the D MOSFET being connected to a bi-metallic switch, where the bi-metallic switch acts as a temperature sensing circuit breaker. In combination, the D MOSFET and bi-metallic switch are able to limit current to downstream circuit components, thus protecting the components from damage.

Metal-Oxide Semiconductor Field-Effect Transistor devices, known as MOSFETs, are semiconductor devices used for switching and amplifying electronic signals in electronic devices. By adjusting a voltage on its gate, the width of a channel disposed between the source and drain of the MOSFET is varied. MOSFETs come in a variety of configurations, based on whether they are P-channel devices built with N-type substrates, N-channel devices built with P-type substrates, vertically disposed semiconductors, laterally disposed semiconductors, depletion mode, and enhancement mode.

In contrast to enhancement mode MOSFETs, which are turned on by the application of a voltage across the gate, depletion mode MOSFETs are known as "normally-on" devices when the gate terminal is at zero volts ($V_{GS}=0$ V). In addition to having a thin gate oxide between the source and drain regions, a conductive channel is formed beneath the gate oxide layer and between the source and drain regions using ion implantation. The concentration of active dopants in the substrate-to-channel region is used to adjust the threshold voltage ($V_{Th}$) of the MOSFET to a desired value. Despite the name, many modern MOSFETs may be manufactured with a polysilicon gate, rather than metal, atop the insulating gate oxide.

Bi-metallic switches are switches consisting of two metal strips that are joined together (back-to-back). The bi-metallic switch would be placed in a circuit between two connection points. The first metal strip has a first thermal expansion coefficient and the second metal strip has a second, different thermal expansion coefficient. Upon application of heat to the bi-metallic switch, the switch will temporarily deform, or bend, based on these two different thermal expansion coefficients once the temperature exceeds an "open" threshold. Where the bi-metallic switch consists of two back-to-back strips of metal of a predefined length, the application of heat will cause the switch to "shorten" or one end to "lift" such that the switch no longer maintains the predefined length, thus becoming unattached to both connection points of the circuit, resulting in an open circuit condition. Where the bi-metallic switch is part of a manufactured package (such as a KSD-01F Temperature Switch Thermostat, discussed further below), the package includes two extending legs that will change their relative positions during heating, thus resulting in the disconnect from the connection points of the circuit, resulting in the open circuit condition. In either configuration, once the bi-metallic switch cools down again, the switch will unbend or conform back to its original shape (which is generally flat), thus causing the switch to be again attached between the two connection points and closing the circuit.

FIG. 1 is a representative drawing of a protection circuit 100, according to exemplary embodiments. The protection circuit 100 (also known herein as "circuit") consists of a bi-metallic switch 102 and a depletion mode MOSFET 104 (hereinafter, "D MOSFET" or "MOSFET") connected in series with one another. The D MOSFET 104 includes a drain (D) and source (S), through which current flows, and a gate (G) which, under certain voltage conditions, will affect current flow between the drain and source. As a depletion mode device, the D MOSFET 104 is normally "on", with current flowing between drain (D) and source (S), despite the gate (G) voltage being 0 V. The bi-metallic switch 102 provides an electrical path between nodes 110 and 112 when the switch is closed, and causes an open circuit when the switch is not closed. One end of the bi-metallic switch 102 also connects to the drain (D) of the D MOSFET 104.

The protection circuit 100 further includes a resistor 106, connected at a first end to the source (S) of the MOSFET 104 and at a second end to the gate (G) of the MOSFET. The voltage across the resistor 106 is thus the same as the gate-to-source voltage of the MOSFET 104. The second end of the resistor 106 (as well as the gate of the MOSFET 104) connect to additional circuit elements to be protected 108, which are downstream of the already described circuit elements and shown generally in FIG. 1.

In exemplary embodiments, the D MOSFET 104 is a current limiter and the bi-metallic switch 102 acts as a temperature sensing circuit breaker. The bi-metallic switch 102 of the protection circuit 100 consists of two different metal strips attached to one another back-to-back. The first metal strip has a first thermal expansion coefficient and the second metal strip has a second, different thermal expansion coefficient. This difference causes the switch 102 to exhibit a temporary deformation (such as a bend) when the temperature sensed by the bi-metallic switch exceeds a threshold temperature. The temporary deformation causes the bi-metallic switch 102 to no longer connect to both nodes 110 and 112, resulting in an open circuit. Because the threshold temperature causes the bi-metallic switch 102 to open the protection circuit 100, the threshold temperature is also known herein as the "open threshold temperature" and the "trip point" or "time to trip" temperature.

In exemplary embodiments, the combination of the bi-metallic switch 102 and D MOSFET 104 provide overcurrent protection to the circuit 100. The overcurrent condition may be characterized as either 1) a transient overcurrent or 2) a constant overcurrent, as illustrated in FIG. 1. Once there is an overcurrent condition, the D MOSFET 104 generates heat, which activates the thermal sensing characteristics of the bi-metallic switch 102. The temporary deformation of the bi-metallic switch 102 means that the open threshold temperature was reached, such that the bi-metallic switch 102 fails to connect to one or more nodes 110 and 112 of the circuit 100, resulting in the open circuit.

Once the fault overcurrent condition subsides, the two metal strips of the bi-metallic switch 102 will cool down, causing the switch to return from the temporarily deformed state to its original state. This causes the bi-metallic switch 102 to again establish connection between both nodes 110 and 112 of the circuit 100, resulting in a closed circuit. The bi-metallic switch 102 thus provides a circuit breaking condition of the protection circuit 100, which is a fail-safe environment for safe-guarding the other electronics systems or devices within the circuit (indicated in FIG. 1 as "additional circuit elements 108").

Within the protection circuit 100, the D MOSFET 104 is able to provide a fast response and blocking capability to overcurrent and overvoltage events and is able to quickly clamp surge current events. The overcurrent clamping capability of the D MOSFET absorbs fast transient surge energy, which protects some harmful transient surges from reaching into the sensitive electronics (additional circuit elements 108) to be protected.

In contrast, the bi-metallic switch 102 provides a high current breaking capability. However, the bi-metallic switch 102 is unable to respond quickly to protect against fast transient events. The combination of the bi-metallic switch 102 and the D MOSFET 104 thus helps utilize the advantages of both devices to provide improvement in overcurrent and overvoltage protection, in exemplary embodiments.

In an exemplary embodiment, the D MOSFET 104 is a IXTH16N50D2 depletion mode MOSFET (with $V_{DSX}$=500V, $I_{D(on)}$=16 A, $R_{DS(on)}$=300 mOhm), manufactured by Littelfuse® and the bi-metallic switch 102 is a KSD-01F Temperature Switch Thermostat, manufactured by Dongguan Fukuanyuan Electronics Co. Ltd (fuyuanfuse.com). As shown in FIG. 1, the bi-metallic switch 102 is connected to the input terminal drain (D) pin of the D MOSFET 104. The resistor 106 is connected between the G-S terminals of the D MOSFET 104. The bi-metallic switch 102 acts as a conducting switch. During normal operation, the bi-metallic switch 102 allows current to pass through it, providing that the current does not exceed the open threshold temperature (this may also be thought of as a "trigger level" for the bi-metallic switch 102).

A drain current of the MOSFET 104, shown as $I_D$, starts to flow through the D-S terminal of the D MOSFET 104 until the gate-to-source voltage, $V_{GS}$, potential difference ($I_D \times R$) reaches a level which causes a more negative $V_{GS}$ to block further current from passing through the D MOSFET 104. In one embodiment, as the applied voltage increases, the current flow will increase in linear mode until a saturation state is achieved. A balance is achieved in which the combination circuit (including the bi-metallic switch 102 and the D MOSFET 104) will allow a maximum saturation current, $I_{sat}$, of the D MOSFET to flow through the circuit 100. In this state, energy is also being dissipated in the D MOSFET 104, with $I_{sat} \times V_{DS}$, as heat as well.

In exemplary embodiments, the saturation current, $I_{sat}$, is the maximum steady state current passing through the D MOSFET 104. This means that as long as the saturation current is not exceeded, the D MOSFET will maintain functionality without chip failure or failure due to overheating. If the overload current is less than $I_{sat}$, the D MOSFET 104 still dissipates the energy as heat without any problem. However, if there is a very high short circuit at the input side that reaches into the D MOSFET, thus exceeding its $I_{sat}$ (saturation current) value, the D MOSFET will react quickly and dissipate the excessive current into heat more quickly.

This, in turn, causes a higher temperature increase of the outer packaging of the D MOSFET 104 to quickly trip the bi-metallic switch 102, which stops further current from breaking the D MOSFET. Nevertheless, prolonged current going beyond the MOSFET's saturation current, $I_{sat}$, will cause over-heating of the D MOSFET to exceed its maximum junction temperature, resulting in chip failure, and loss of MOSFET function. Thus, the bi-metallic switch helps protect the D MOSFET from over-heating failure as well.

In an exemplary embodiment, the protection circuit 100 is operated with an applied current ranging from 0 A up to the $I_{sat}$ saturation current. An abnormal condition may result in a sudden rise of the input current, $I_D$. The abnormal condition may be caused, for example, by a short circuit on the load, load switching, or a sudden overload condition. These cause an up-surge of current passing through the bi-metallic switch 102 and the D MOSFET 104. If this current stays below the saturation current, $I_{sat}$, the D MOSFET will gradually heat up due to power dissipation to the MOSFET. However, if the overcurrent exceeds the saturation current $I_{sat}$, then there will be a dramatic increase in input current, $I_D$, with heat dissipation to the D MOSFET ($I_D \times V_{DS}$), resulting in the bimetallic switch tripping even faster to protect the D MOSFET. This will cause the bi-metallic switch 102 to reach its disconnect level, thus disconnecting from one or more of the nodes 110, 112, at the open threshold temperature. Thus, the bimetallic switch also provides cut-off protection to the D MOSFET within the safe operating area and thermal limit.

In one embodiment, when the disconnection at nodes 110 and/or 112 occurs, the overall current flowing through the protection circuit 100 is cut off, which removes current flow to the D MOSFET 104, causing heat dissipation of the MOSFET, and ultimately saves the D MOSFET from over-heating by removing the sustained overcurrent.

The protection circuit 100 thus advantageously provides a feedback mechanism that tends to provide quicker protection to the D MOSFET 104 as the severity of the short circuit current event increases. Thus, the higher the level of short circuit current, the more quickly the bi-metallic switch 102 is able to cut off current to the D MOSFET 104, and thus protect the D MOSFET from overheating damage. This feedback arises because the high heat generated by the D MOSFET 104 from the overvoltage/overcurrent condition causes the bi-metallic switch 102 to open more quickly, thus preventing further current from passing through the D MOSFET and removing this self-heating, and ultimately protecting the downstream additional circuit elements 108.

Figure 2:
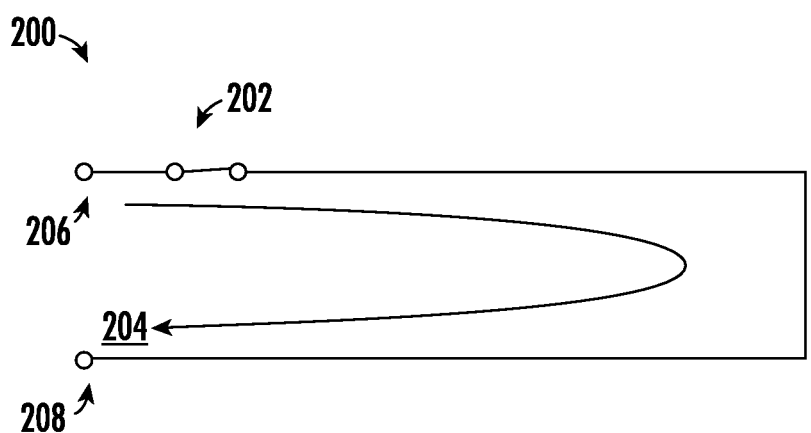
FIG. 2 is a diagram illustrating a protection circuit including a standalone bi-metallic switch, in accordance with exemplary embodiments.
Figure 3:
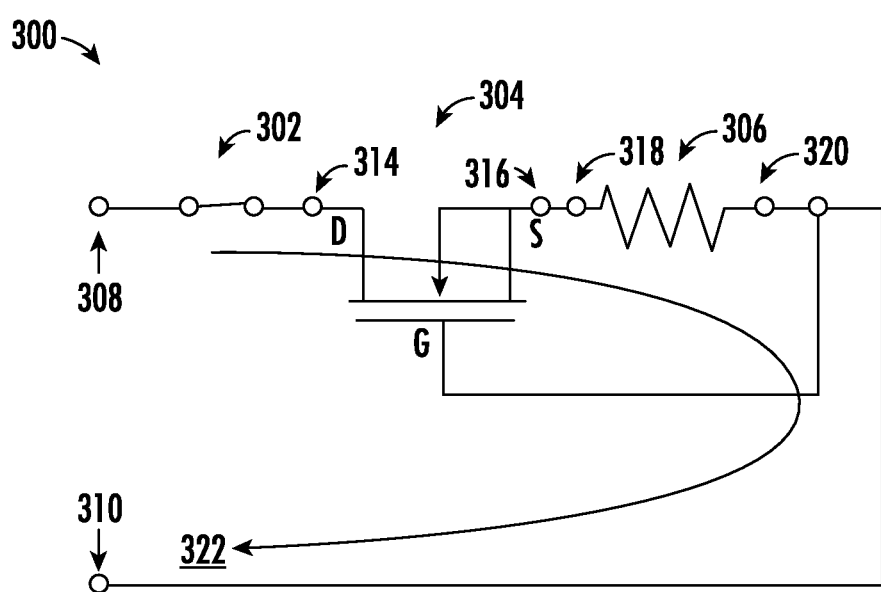
FIG. 3 is a diagram of a device for providing overcurrent protection to a circuit, in accordance with exemplary embodiments.
Figure 4:
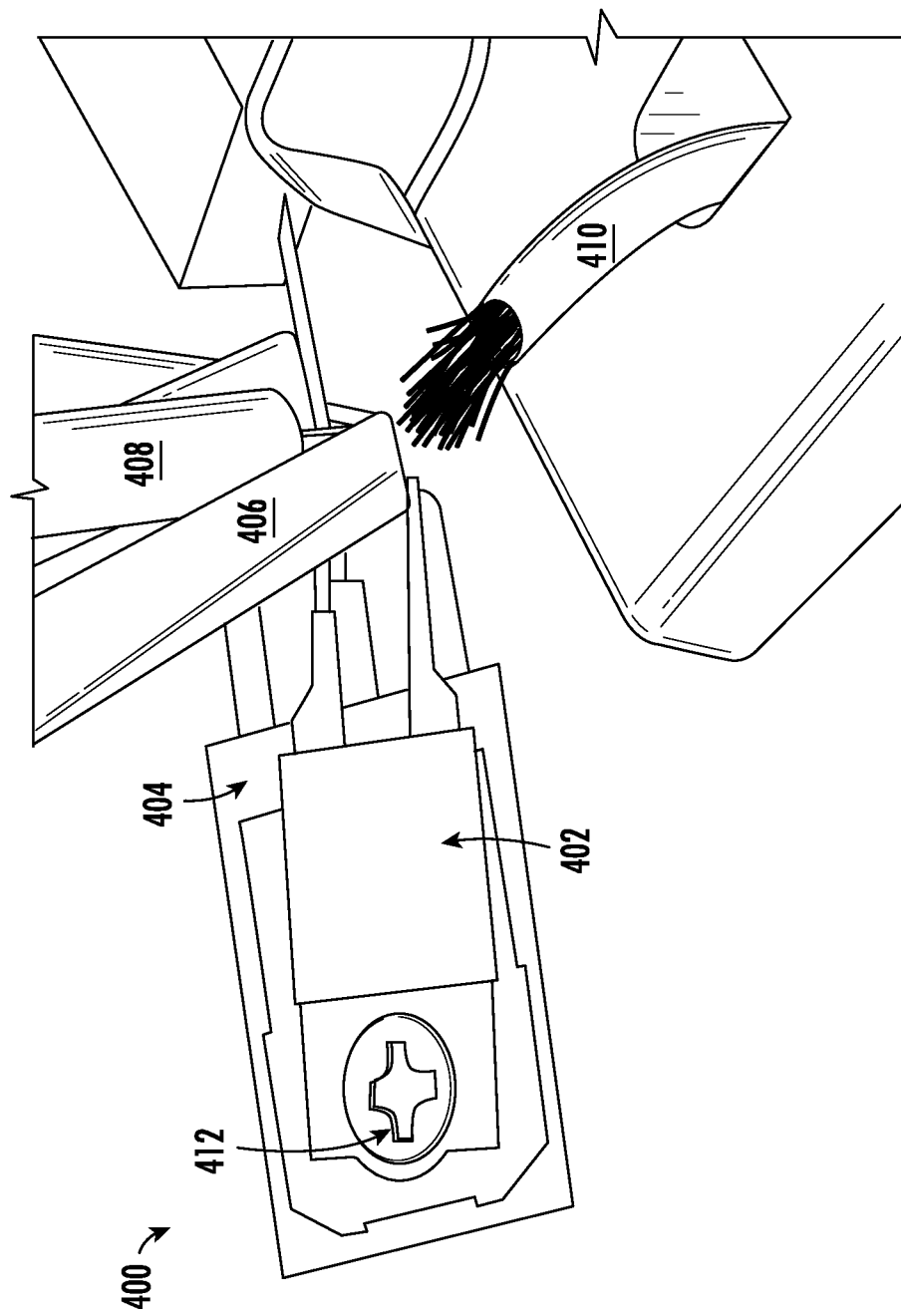
FIG. 4 is an illustration of a bi-metallic switch screwed and bolted to a D MOSFET, in accordance with exemplary embodiments.

FIGS. 2, 3, and 4 are illustrations of protection circuits 200, 300, and 400, respectively, used to illustrate the results of a continuous current test, according to exemplary embodiments. In exemplary embodiments, the bi-metallic switch is a KSD-01 Temperature Switch Thermostat (triggers at 60° C. and operating current @ 2 A 250V), the D MOSFET is a IXTH16N50D2 depletion mode MOSFET (with $V_{DSX}$=500V, $I_{D(on)}$=16 A, $R_{DS(on)}$=300 mOhm), and the resistor 206 is a 0 Ohm resistor. In FIG. 2, the bi-metallic switch 202 is a standalone device uncoupled to a MOSFET. In FIG. 3, a bi-metallic switch 302 is connected to a D MOSFET 304 and a resistor 306, with the circuit elements similarly arranged as in the protection circuit 100 of FIG. 1. In FIG. 4, the bi-metallic switch 402 (KSD-01F) is tied to the D MOSFET 404 (TO247 package) in a back-to-back approach with a screw 412 and bolt (not visible). In one embodiment, the bi-metallic switch 402 and D MOSFET 404 are further thermally linked to one another using thermally conductive epoxy adhesive (not shown). In another embodiment, the bi-metallic switch 402 and D MOSFET 404 are further thermally linked to one another using conductive epoxy gel. Further, the bi-metallic switch 402 and the D MOSFET 404 are electrically connected to one another and to other parts of the circuit via wires 406, 408, and 410. The KSD-01F bi-metallic switch consists of a bi-metallic disc, a metal bridge connecting the two legs of the device, a metal bridge contact, and a plastic case which is isolated with a heat sink. The bi-metallic disc will bend at a specific temperature, which makes the metal bridge connect or disconnect the legs, thus closing or opening the circuit.

In FIGS. 2 and 3, respective arrows 204 and 322 show the direction of the current flow. In the circuit 200 featuring the standalone bi-metallic switch 202, current 204 flows from node 206 to node 208 while the switch is closed. When the bi-metallic switch 202 is opened, no current flows. In the circuit 300 featuring the bi-metallic switch 302, D MOSFET 304, and resistor 306, current 322 flows from the node 308, through the closed bi-metallic switch 302, from the node 314 to the node 316 of the D MOSFET 304 (drain-to-source), from the node 318 to the node 320 of the resistor 306, and finally to the node 310. Because the resistor 306 is connected between the source and the gate of the D MOSFET 304, the voltage across the resistor 306 as the current 322 flows is the same as the gate-to-source voltage, $V_{GS}$, of the D MOSFET. Thus, the voltage across the nodes 314 and 316 (in gray) are the drain-to-source voltage, $V_{DS}$, of the D MOSFET 304 while the voltage across the nodes 318 and 320 (in white) are the gate-to-source voltage, $V_{GS}$.

The circuit 300 may also be a standalone device 300 consisting of the bi-metallic switch 302, the D MOSFET 304, and the resistor 306. The overcurrent protection device 300 may thus be added to any circuit needing overcurrent protection.

Overcurrent test currents were conducted to evaluate the trip time of the bi-metallic switch under three sets of conditions:

Test current with 100% (2 A), 200% (4 A), 300% (6 A), 400% (8 A), 500% (10 A), 600% (12 A), 700% (14 A), 800% (16 A), 1000% (20 A), and 1200% (24 A) of applied current (below the saturation current, $I_{sat}$) with the bi-metallic switch 202 as a standalone device (FIG. 2)

Test current with 100% (2 A), 200% (4 A), 300% (6 A), 400% (8 A), 500% (10 A), 600% (12 A), 700% (14 A), 800% (16 A), 1000% (20 A), and 1200% (24 A) of applied current (below the saturation current, $I_{sat}$) with the bi-metallic switch 202 connected to the D MOSFET 204 (FIG. 3)

Test current with 100% (2 A), 200% (4 A), 300% (6 A), 400% (8 A), 500% (10 A), and 600% (12 A)), 700% (14 A), 800% (16 A), 1000% (20 A), and 1200% (24 A) of applied current (below the saturation current, $I_{sat}$) with the bi-metallic switch 202 thermally linked to the D MOSFET 204 using a screw and bolt (FIG. 4)

Because the bi-metallic switch used in these tests, the KSD-01 Temperature Switch Thermostat, has an operating current of 2 A (at 250V), a 2 A input represents 100% of its operating current. These tests are thus conducted to measure the trip time of the bi-metallic switch at various operating conditions. Thus, with the exception of the first test at 2 A, the device is tested at multiples of its normalized current rating, with the most extreme test occurring at twelve times (24 A) the current rating of the device.

Figure 5:
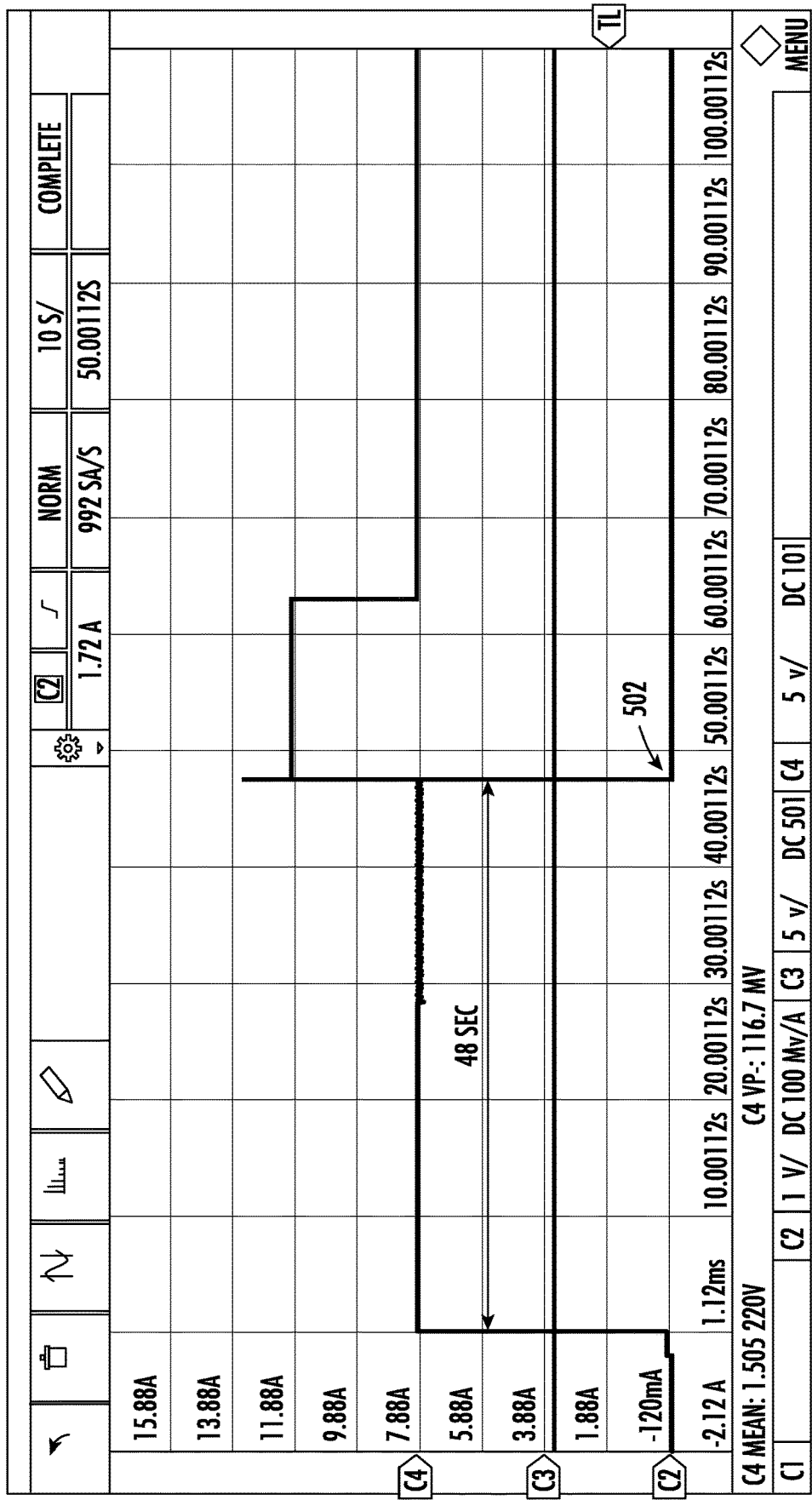
FIG. 5 is a response waveform for an experiment performed with the standalone bi-metallic switch of FIG. 2, in accordance with exemplary embodiments.

FIG. 5 is a response waveform 500 for the standalone bi-metallic switch 202 of FIG. 2, in which a 10V source supplies an 8 A current (400% of the switch's current rating) to the circuit 200, according to exemplary embodiments. Even though the current flowing through the bi-metallic switch 202 is rated at four times the normalized current rating of the device, it still takes 48 seconds to reach the device trip point 502. This is not ideal, as the long time to trip for a bimetallic switch under four times normalized current will put a very high stress on the downstream components, increasing the likelihood of failure.

Figure 6:
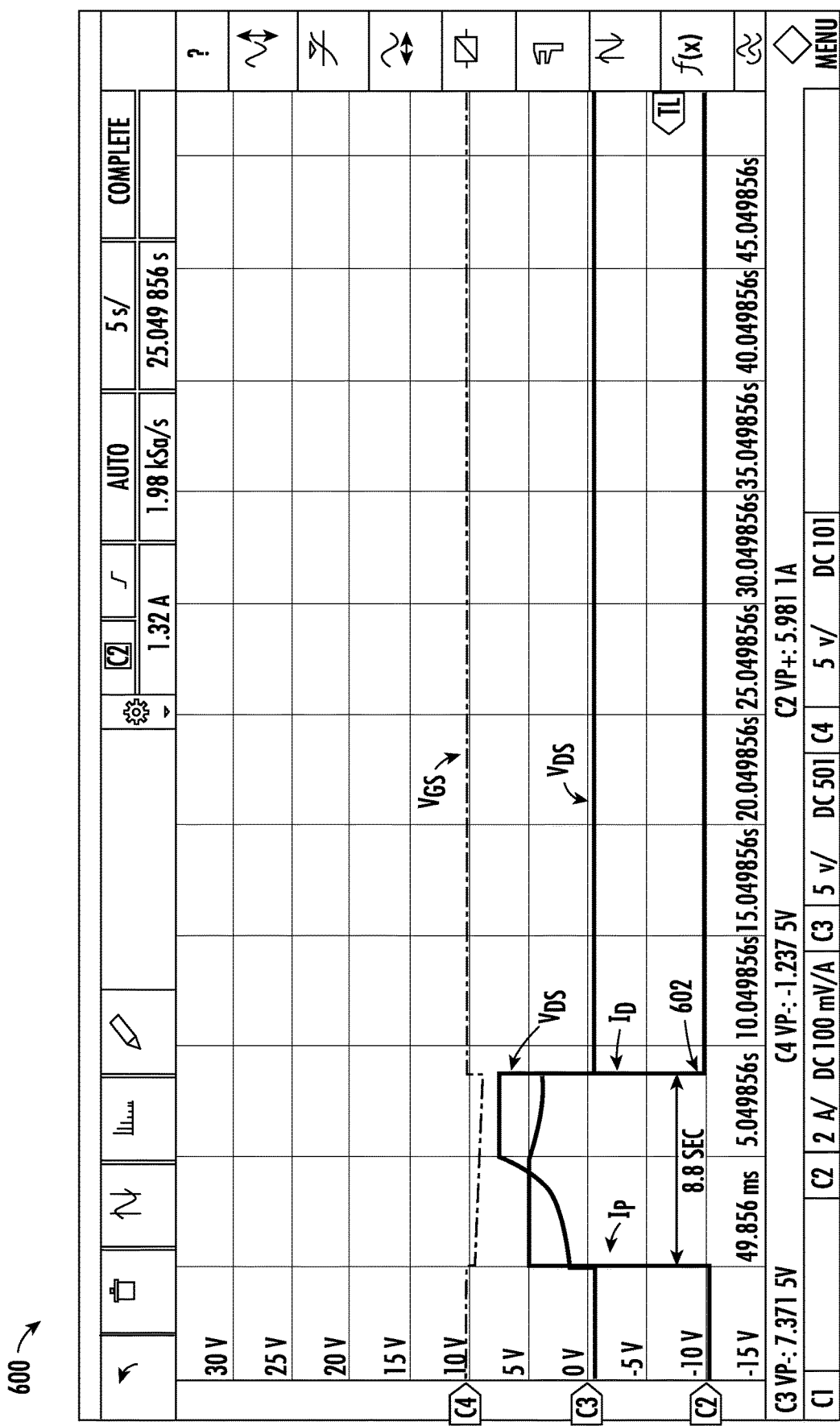
FIGS. 6 and 7 are response waveforms for an experiment performed between the bi-metallic switch and D MOSFET of FIG. 3, in accordance with exemplary embodiments.
Figure 7:
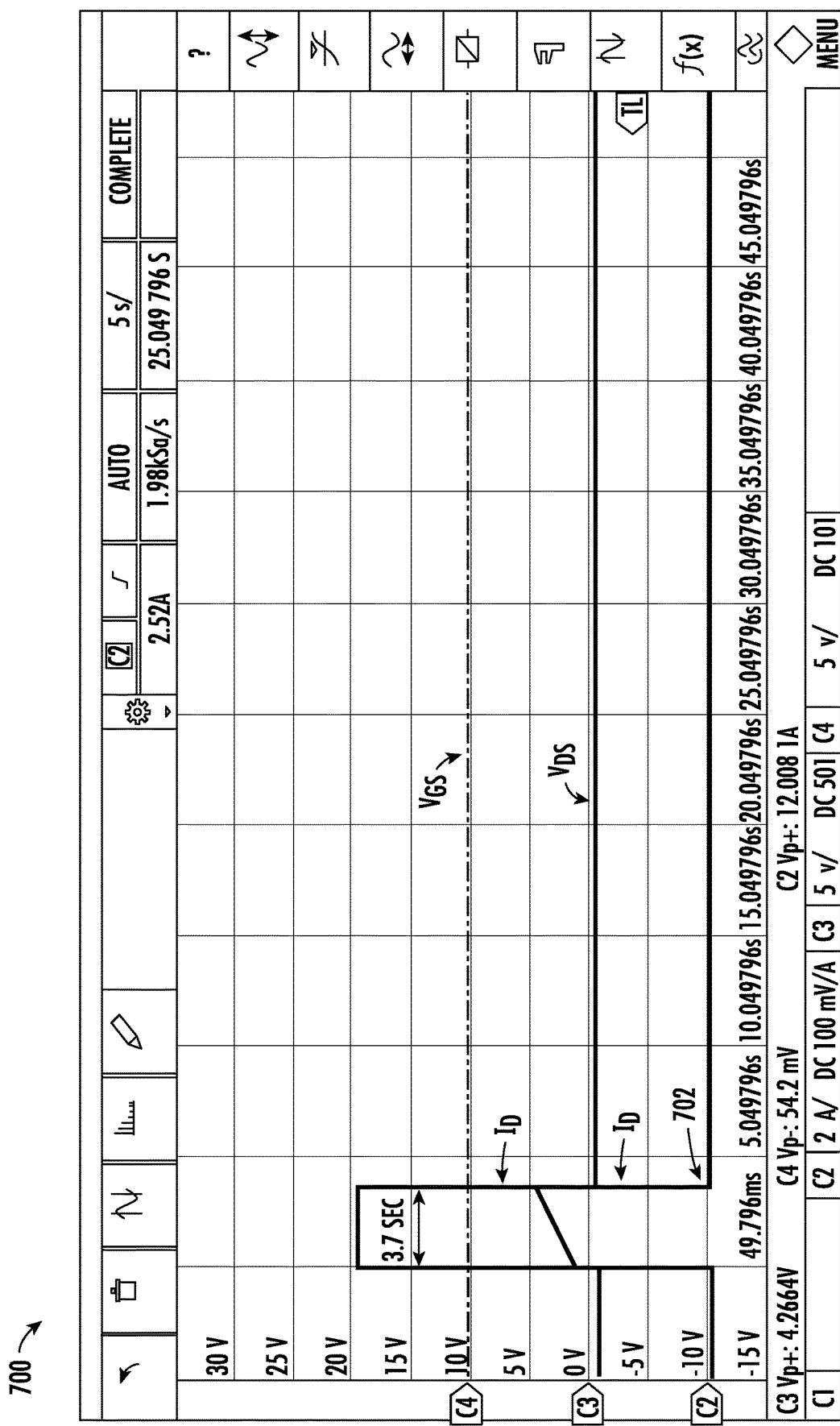

FIG. 6 is a response waveform 600 for the bi-metallic switch 302 connected to the D MOSFET 304 of FIG. 3, in which a 10V source supplies 6 A (300% of the switch's current rating) to the circuit 300, in accordance with exemplary embodiments. As shown in the waveform 600, a 10V 6 A overcurrent condition was applied to the protection circuit 300 (FIG. 3) to measure its response. The current through the D MOSFET 304 ($I_D$) (C2) and the voltage across the bi-metallic switch 302 and the D MOSFET 304 ($V_{DS}$) (C3), were monitored and captured versus a time plot. Their scales are marked at the bottom of the waveform 600. The trip point 602 is the point where the bi-metallic switch 302 was starting to disconnect FIG. 7 is a response waveform 700 for the bi-metallic switch 302 connected to the D MOSFET 304 of FIG. 3, in which a 10V source supplies 12 A (600% of the switch's current rating) to the circuit 300, in accordance with exemplary embodiments. In this example, the resistor 306 is at 0 Ohms. As shown in the waveform 700, a 10V 12 A overcurrent condition was applied to the protection circuit 300 (FIG. 3) to measure its response. At the trip point 702, the current, $I_D$, flowing from the D MOSFET 304 drops quickly from 12 A to 0 A while the voltage across the MOSFET, $V_{DS}$, drops from 10V to 0V. Right before the trip point 702, the MOSFET 304 takes around 4.27V×12 A=54.24 W of power dissipation (see table 800 of FIG. 8, below). The 600%, 12 A rated current brought about the heat dissipation in the D MOSFET 304, which caused the temperature of the MOSFET packaging to increase and reach a level of disconnection of the bi-metallic switch 202 at 60° C. In the example illustrated in the table 800 (FIG. 8), it took about 3.7 seconds for the trip point 702 of the bi-metallic switch 202 to be reached. Thus, in exemplary embodiments, as illustrated by these waveforms, the response time to cut off the overcurrent event depends not only on the overcurrent magnitude but also the intrinsic heat dissipation caused by the D MOSFET 304.

FIG. 8 includes a table 800 to illustrate results of overcurrent test current operations, according to some embodiments. Further tests were conducted with different currents, with and without the presence of the D MOSFET 304, as shown. In these examples, the IXTH16N50D2 D MOSFET and a bi-metallic switch with a 60° C. trigger were tested with rated current below the saturation current, Lat.

Table 800 provides a summary of the tests with different current and bi-metallic switch trip response. The top of the table 800 provides time to trip information for the bi-metallic switch 302 connected to the D MOSFET 304 (FIG. 3) at eight current conditions (6 A, 8 A, 10 A, 12 A, 14 A, 16 A, 20 A and 24 A); the bottom of the table 800 provides time to trip information for the bi-metallic switch 202 without connection to a D MOSFET (FIG. 2), at the same eight current conditions. Table 800 shows that the time to trip of the standalone bi-metallic switch 202 (FIG. 2) is 8 seconds (with 12 A current). With the same 12 A applying to the D MOSFET combined with the bimetallic switch circuit (FIG. 3), the time to trip shortens to only 3.7 s. Thus, in exemplary embodiments, the time to trip is much faster/improved with 3× to 6× current range for D MOSFET+ bimetallic switch.

Table 800 also shows that the bi-metallic switch does not trip at 2 A (100%) or 4 A (200%) applied current. Instead, the bi-metallic switch starts to trip at 6 A (300%) due to the fact that there is sufficient energy to thermally activate the bi-metallic switch at the 6 A current.

As these experiments illustrate, in exemplary embodiments, the presence of the D MOSFET speeds up the trip of the bi-metallic switch in all current ratios. The resistance, R, determines the maximum allowable current to passing through the D MOSFET in a steady state, which is the $I_{sat}$ saturation current. Using a 0 ohm resistor will allow a high $I_{sat}$ value compared to that using a R=0.1 ohm resistor, in an exemplary embodiment. When the resistor 306 is zero, the $V_{GS}$ of the MOSFET 304 is also zero. But, by increasing the resistance slightly (e.g., R=0.1 ohm), the gate-to-source voltage, $V_{GS}$, of the MOSFET 304 will become slightly negative, and will start to pinch off and limit the current flowing through the D MOSFET.

By increasing the resistance, R, both the saturation current, $I_{sat}$, and the gate-to-source voltage ($V_{GS}$) will change, such that power across the D MOSFET varies and is able to provide more power dissipation to the D MOSFET. In exemplary embodiments, these considerations will facilitate the selection of different bi-metallic switches to work with different ratings of circuit breakers.

Figure 9:
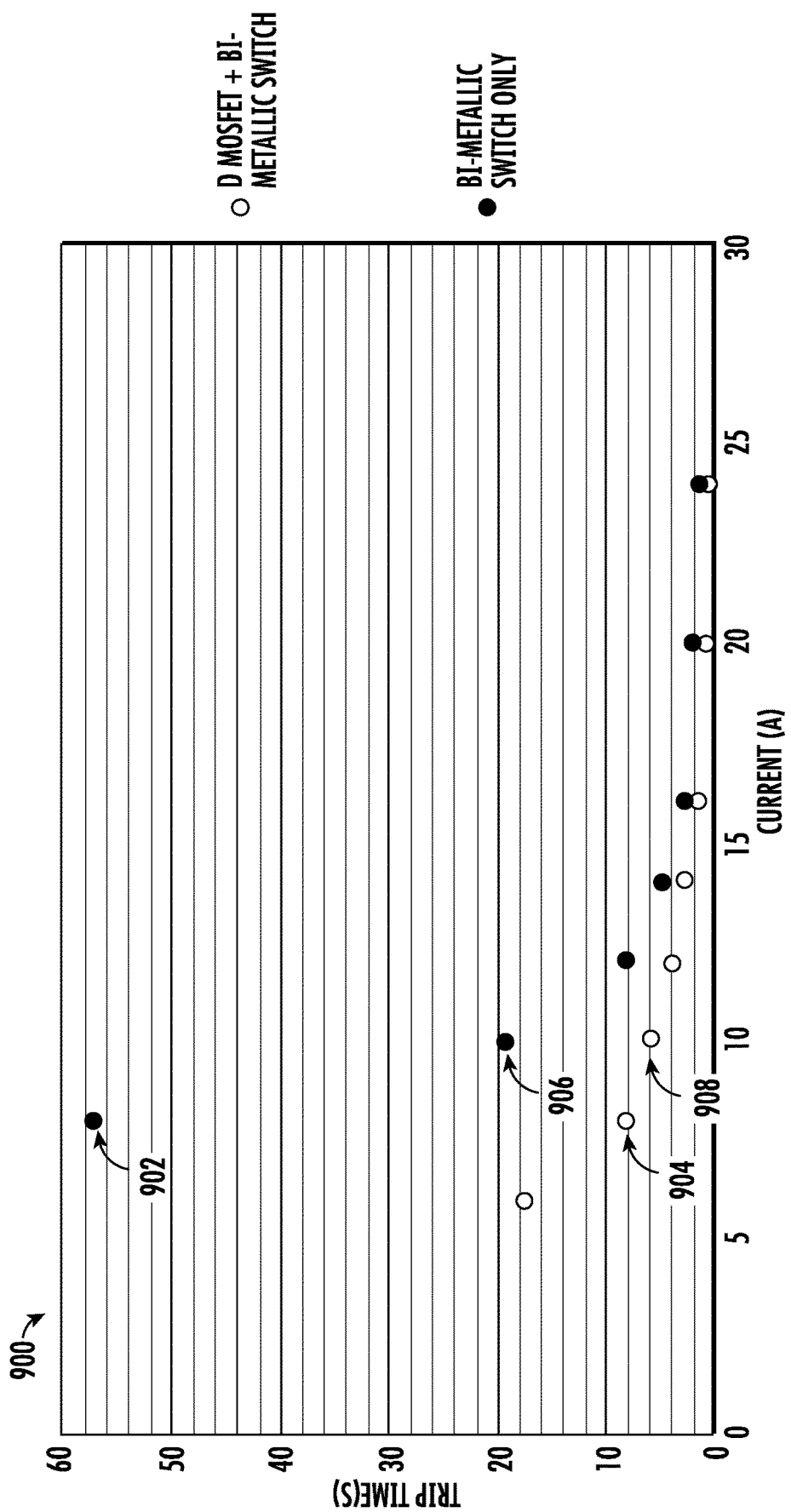
FIG. 9 is a graph comparing trip response time between circuit having a standalone bi-metallic switch versus circuit having a bi-metallic switch with a D MOSFET, in accordance with exemplary embodiments.

FIG. 9 includes a graph 900 which illustrates an improved trip response time of both types of protection circuits: 1) bi-metallic switch with no MOSFET (FIG. 2) and 2) bi-metallic switch with MOSFET (FIG. 3). The graph 900 shows the trip time in seconds (y-axis) versus current in Amps (x-axis) for the bi-metallic switch. The dark circles show trip times for standalone bi-metallic switches (e.g., FIG. 2) while the light circles show trip times for bi-metallic switches plus the D MOSFET (e.g., FIG. 3). Once the bi-metallic switch is combined with the D MOSFET, there is a shift of the trip time from right to left in the graph 900 and from the top down closer to the bottom (meaning shorter time to trip), which is within the safe operating curve of the bi-metallic switch tripping time. Thus, adding a D MOSFET with a bimetallic switch will enhance the overall time to trip and provide a much faster protection to the downstream electronics.

The benefit provided by the D MOSFET is evident in the graph 900. For example, the time to trip for a standalone bi-metallic switch at 8 A, given by dark circle 902, is about 57 seconds whereas the time to trip for a bi-metallic switch plus D MOSFET at the same current, given by light circle 904, is about 8 seconds. Similarly, the time to trip for the standalone bi-metallic switch at 10 A, given by dark circle 906, is about 19 seconds whereas the time to trip for the combination circuit (light circle 908) is about 6 seconds. Only at the higher currents does the standalone bi-metallic switch compare favorably to the combination circuit, which makes sense because the current rating of the switch has been far exceeded. The graph 900 thus illustrates the benefit of having the combination circuit consisting of both the bi-metallic switch and the D MOSFET working together to protect against overcurrent conditions.

Returning to the protection circuit 200 of FIG. 2, the circuit includes the standalone bi-metallic switch 202 undergoing a surge test, according to exemplary embodiments. The test is performed with a surge current at 1.2/50 μsec, with a peak voltage of 500V at 2 Ohms. FIG. 3, by contrast, shows a circuit 300 with a bi-metallic switch 302 connected to the drain of a D MOSFET 304 and a resistor 306 connected between the source and gate of the MOSFET. One variant of this circuit 300 would include no resistor. Again, the test is performed with a surge current at 1.2/50 μsec, with peak voltage of 500V at 2 Ohms. In both circuits 200 and 300, the bi-metallic switch is a KSD-01 Temperature Switch Thermostat while, in the circuit 300, the D MOSFET 304 is a IXTH16N50D2 depletion mode MOSFET (with $V_{DSX}$=500V, $I_{D(on)}$=16 A, $R_{DS(on)}$=300 mOhm).

Figure 10:
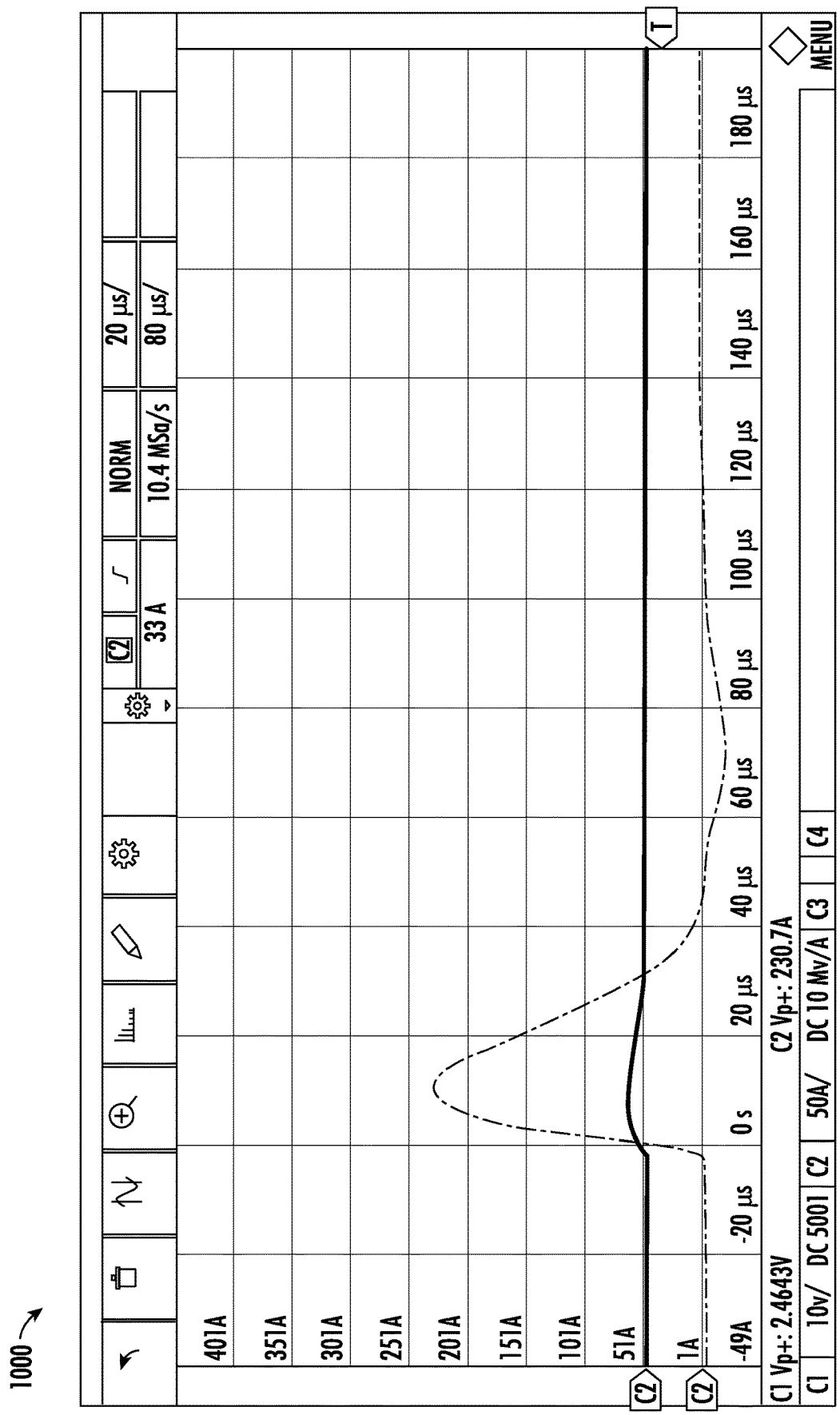
FIG. 10 is a response waveform for an experiment performed on the standalone bi-metallic switch circuit of FIG. 2, in accordance with exemplary embodiments.

FIG. 10 includes a response waveform 1000 which illustrates a surge response for the bi-metallic switch in a standalone circuit, such as the circuit 200 of FIG. 2, according to some embodiments. There is a 1.2/50 μsec surge waveform, with a peak voltage of 500V and 2 Ohms as fictive impedance. As shown in the waveform 1000, the surge current going through the bi-metallic switch (C2) has a response of 230.7 A peak. To transform the voltage waveform, the peak voltage is 230.7 A×2 Ohm=461.4V. The voltage across the bi-metallic switch (C1) stays almost constant at 10V, with some slight rise with the incoming surge. The surge, however, does not trigger the bi-metallic switch to open. Thus, the switch does not trigger with this surge condition, in some embodiments.

Figure 11:
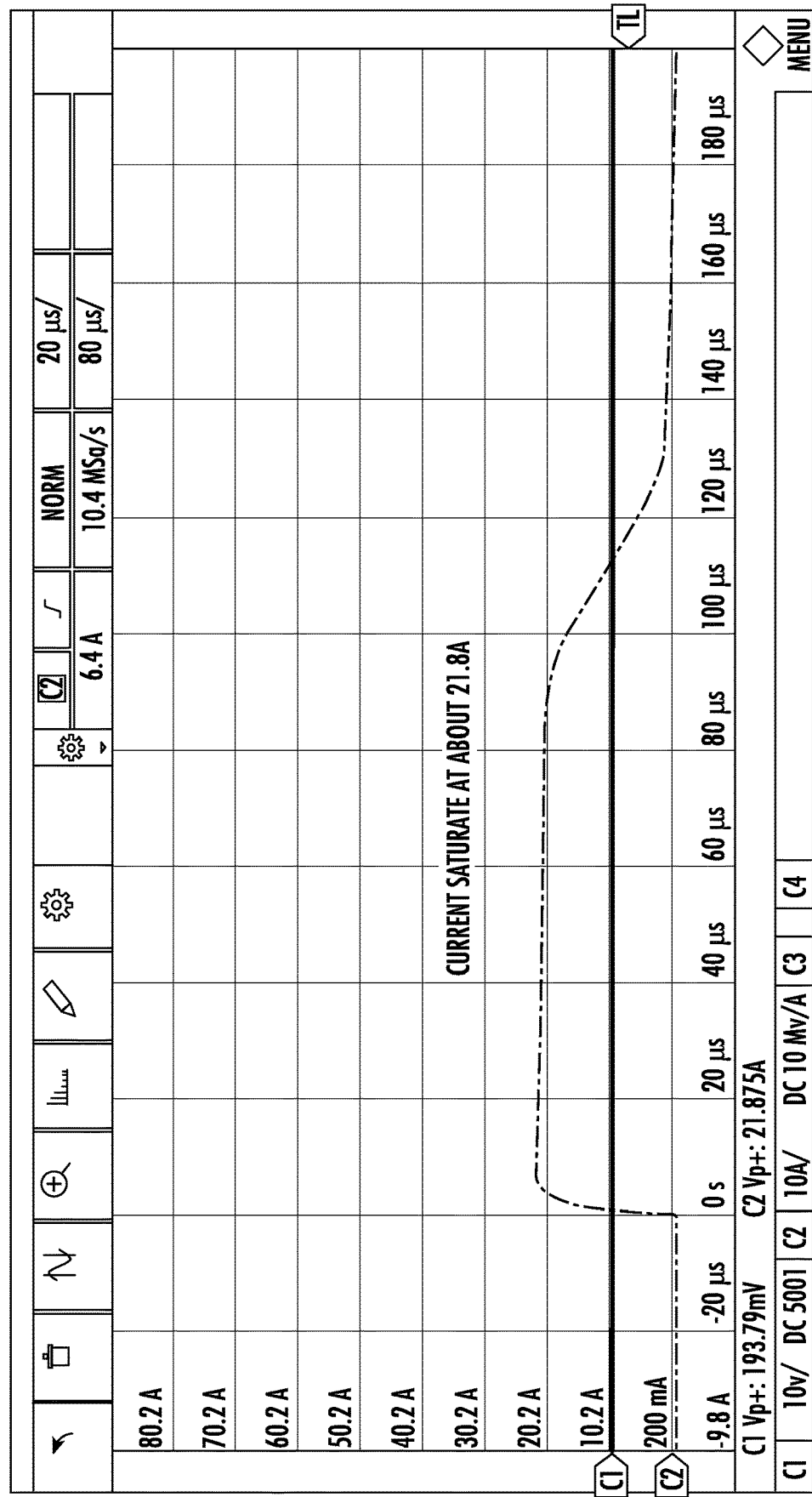
FIG. 11 is a response waveform for an experiment performed on the device including the bi-metallic switch and the D MOSFET of FIG. 3, in accordance with exemplary embodiments.

FIG. 11 includes a response waveform 1100 to illustrate a surge response for a circuit featuring combined D MOSFET and bi-metallic switch, such as the circuit 300 of FIG. 3, according to some embodiments. As shown in the waveform 1100, with the same incoming surge condition, the current passing through the D MOSFET and bi-metallic switch combination is clamped down (C2) and stays "saturated" at a peak current of about 21.8 A at around 40 μsec. The D MOSFET clamps very quickly on the surge and causes the resultant output as a very low current output. This contrasts to the above surge test with the standalone bi-metallic switch (FIG. 10).

Thus, in exemplary embodiments, with the deployment of a D MOSFET with a bi-metallic thermal switch, the trigger time of the switch is much faster than when it triggers standalone with the same applied overcurrent. Further, the resultant surge current is at a much lower, safe level, so as to protect downstream circuit elements.

A D MOSFET plus a bi-metallic switch are able to work closely together in a circuit to provide mutual protection, in exemplary embodiments. Under prolonged overcurrent protection events, the D MOSFET heats up and triggers the switch at the specified trigger temperature, and creating the open current, which both prevents an overcurrent from passing through the downstream components of the circuit and protects the D MOSFET from overheating. The switch resets back from its temporarily deformed position to its normal position once its case cools down to a reset level.

Further, in some embodiments, the combination circuit described herein may become part of a manually reset circuit breaker. These types of circuit breakers are known to have bi-metallic strips, but, once the strip is tripped causing an open circuit, the circuit breakers can only be reset with human intervention. The bi-metallic strip plus D MOSFET disclosed herein may be a suitable substitute for such circuit breakers and may eliminate the need for human intervention to reset them. Both devices (the bi-metallic switch and the D MOSFET) have a self-protecting and self-resettable feature together when they connect in this fashion.

In addition to the bi-metallic switch examples given above, the principles described herein may similarly be applied to other types of thermal switches, mini circuit breakers, and relay-type circuit breakers with bi-metallic switches inside, whether these devices include either self-reset or manual reset functions.

From the above test results, the D MOSFET provides an additional heating effect to speed up the trip of the bi-metallic switch. It has been shown that the bi-metallic switch, with the presence of the D MOSFET, is able to trip much faster in all the overcurrent levels, such as 100%, 200%, and 400%, in some embodiments. The bi-metallic switch and the D MOSFET thus work very closely together and provide mutual protection to one another.

In exemplary embodiments, the above waveforms show that putting the bi-metallic switch before the D MOSFET while putting the switch on top of the D MOSFET package together (as illustrated in FIG. 4) causes mutual benefit of the two devices for protecting against overcurrent events. The D MOSFET acts as a current limiter with (or without) the biasing resistor in the gate-to-source terminal of the MOSFET (e.g., the resistor 306 in FIG. 3). When the D MOSFET has a long-term current limiting event, heat generated from its body (packaging) will heat up the bi-metallic switch to cause the switch to open and protect the D MOSFET from overheating (long-term current, $I>I_{sat}$). In exemplary embodiments, the circuit resets back to normal once the temperature drops to the bi-metallic switch restore level. In exemplary embodiments, the D MOSFET also acts as a surge current limiter to clamp external surges to the circuits to be protected.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure makes reference to certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. A circuit operable to provide overcurrent protection, the circuit comprising:
   a bi-metallic switch having a trip time associated with a current rating, the bi-metallic switch comprising:
      a first metal strip having a first thermal expansion coefficient, wherein the first metal strip is coupled to a first node; and
      a second metal strip having a second thermal expansion coefficient, wherein the second metal strip is coupled to a second node and the first thermal expansion coefficient is different from the second thermal expansion coefficient; and
   a metal oxide semiconductor field effect transistor (MOSFET) comprising a drain coupled to the second node, wherein the MOSFET absorbs fast transient surge energy and heats up in response to an overcurrent event that exceeds the current rating;
wherein:
   the bi-metallic switch, without the MOSFET, disconnects from either the first node or the second node at the trip time; and the bi-metallic switch, in combination with the MOSFET, disconnects from either the first node or the second node in a time period, wherein the time period is shorter than the trip time.

2. The circuit of claim 1, further comprising a resistor coupled between a source of the MOSFET and a gate of the MOSFET.

3. The circuit of claim 1, wherein the MOSFET is a depletion mode MOSFET.

4. The circuit of claim 3, wherein the MOSFET is an N-channel depletion mode MOSFET.

5. The circuit of claim 1, wherein the MOSFET provides a current limiting effect to protect additional circuit elements from being damaged during the overcurrent event.

6. The circuit of claim 1, wherein the bi-metallic switch protects the MOSFET from prolonged overheating due to the overcurrent event by disconnecting from either the first node or the second node and creating an open circuit.

7. The circuit of claim 1, wherein the bi-metallic switch trip temperature is lowered by the presence of the MOSFET.

8. A device to be coupled to a circuit, the device operable to provide overcurrent protection to the circuit, the device comprising:
    a bi-metallic switch having a trip time associated with a current rating, the bimetallic switch comprising:
        a first metal strip having a first thermal expansion coefficient, wherein the first metal strip is coupled to a first node; and
        a second metal strip having a second thermal expansion coefficient, wherein the second metal strip is coupled to a second node and the first thermal expansion coefficient is different from the second thermal expansion coefficient; and
    a metal oxide semiconductor field effect transistor (MOSFET) comprising a drain coupled to the second node, wherein the MOSFET absorbs fast transient surge energy and heats up in response to an overcurrent event that exceeds the current rating;
wherein:
    the bi-metallic switch, without the MOSFET, disconnects from either the first node or the second node at the trip time; and
    the bi-metallic switch, in combination with the MOSFET, disconnects from either the first node or the second node in a time period, wherein the time period is shorter than the trip time.

9. The device of claim 8, further comprising a resistor coupled between a source of the MOSFET and a gate of the MOSFET.

10. The device of claim 8, wherein the MOSFET is a depletion mode MOSFET.

11. The device of claim 10, wherein the MOSFET is an N-channel depletion mode MOSFET.

12. The device of claim 8, wherein the MOSFET provides a current limiting effect to protect additional circuit elements from being damaged during the overcurrent event.

13. The device of claim 8, wherein the bi-metallic switch protects the MOSFET from prolonged overheating due to the overcurrent event by disconnecting from either the first node or the second node and creating an open circuit.

14. The device of claim 8, wherein the bi-metallic switch trip temperature is lowered by the presence of the MOSFET.

* * * * *